(12) United States Patent
Richter et al.

(10) Patent No.: US 10,529,728 B2
(45) Date of Patent: Jan. 7, 2020

(54) SEMICONDUCTOR STRUCTURE INCLUDING A PLURALITY OF PAIRS OF NONVOLATILE MEMORY CELLS AND AN EDGE CELL

(71) Applicant: GLOBALFOUNDRIES Inc., Grand Cayman (KY)

(72) Inventors: Ralf Richter, Radebeul (DE); Martin Gerhardt, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 171 days.

(21) Appl. No.: 15/883,975

(22) Filed: Jan. 30, 2018

(65) Prior Publication Data

US 2018/0158833 A1 Jun. 7, 2018

Related U.S. Application Data

(62) Division of application No. 15/155,483, filed on May 16, 2016, now Pat. No. 9,922,986.

(51) Int. Cl.

| H01L 29/66 | (2006.01) |
| H01L 27/11531 | (2017.01) |
| H01L 27/11524 | (2017.01) |
| H01L 27/11548 | (2017.01) |
| H01L 27/11519 | (2017.01) |
| H01L 29/423 | (2006.01) |
| H01L 27/11529 | (2017.01) |

(Continued)

(52) U.S. Cl.
CPC .. *H01L 27/11531* (2013.01); *H01L 27/11519* (2013.01); *H01L 27/11524* (2013.01); *H01L 27/11529* (2013.01); *H01L 27/11534* (2013.01); *H01L 27/11548* (2013.01); *H01L 29/42328* (2013.01); *H01L 29/435* (2013.01)

(58) Field of Classification Search
CPC ........ H01L 27/11519; H01L 27/11524; H01L 27/11529; H01L 27/11531; H01L 27/11534; H01L 27/11548; H01L 29/42328; H01L 29/435
See application file for complete search history.

(56) References Cited

U.S. PATENT DOCUMENTS

| 5,455,792 A | 10/1995 | Yi |
| 5,883,409 A * | 3/1999 | Guterman ........... G11C 11/5621 257/316 |

(Continued)

*Primary Examiner* — Meiya Li
(74) *Attorney, Agent, or Firm* — Amerson Law Firm, PLLC

(57) ABSTRACT

A semiconductor structure includes a plurality of pairs of nonvolatile memory cells arranged in a row, an edge cell positioned adjacent to the pairs of nonvolatile memory cells, and first, second, third, and fourth gates. Each pair of nonvolatile memory cells includes first and second nonvolatile memory cells. The first and second gates extend across the first nonvolatile memory cells, the second gate partially overlapping the first gate, and the third and fourth gates extend across the second nonvolatile memory cells, the fourth gate partially overlapping the third gate. Each of the first, second, third, and fourth gates has an end portion that is positioned in the edge cell, and the edge cell includes a protection layer that is positioned over the end portions of the first, second, third, and fourth gates and covers an end face of the second and fourth gates.

20 Claims, 12 Drawing Sheets

(51) Int. Cl.
*H01L 27/11534* (2017.01)
*H01L 29/43* (2006.01)

(56) References Cited

U.S. PATENT DOCUMENTS

| | | | |
|---|---|---|---|
| 6,747,310 B2 | 6/2004 | Fan et al. | |
| 7,349,250 B2 * | 3/2008 | Ito | G11C 16/0466 365/185.05 |
| 7,868,375 B2 | 1/2011 | Liu et al. | |
| 8,901,632 B1 * | 12/2014 | Perera | H01L 29/7831 257/314 |
| 2015/0187784 A1 * | 7/2015 | Tan | H01L 27/11551 257/321 |

* cited by examiner

SEMICONDUCTOR STRUCTURE INCLUDING A PLURALITY OF PAIRS OF NONVOLATILE MEMORY CELLS AND AN EDGE CELL

BACKGROUND

1. Field of the Disclosure

Generally, the present disclosure relates to the field of integrated circuits and, more particularly, to integrated circuits including nonvolatile memory devices.

2. Description of the Related Art

Nonvolatile memory such as, for example, flash memory may be used in various storage devices such as, for example, secure digital memory cards (SD cards), USB sticks, solid state drives (SSDs) and internal memory of various electronic devices, such as, for example, mobile phones, tablet computers, media players, etc. Further applications of nonvolatile memory include embedded systems, wherein nonvolatile memory blocks including nonvolatile memory are provided in addition to logic devices and wherein the nonvolatile memory devices and the logic devices are physically and electrically integrated on a single substrate, for example, a single monolithic silicon substrate. Devices that can be provided on the monolithic silicon substrate in addition to nonvolatile memory cells may include logic transistors, being field effect transistors that are provided in logic circuits on the monolithic silicon substrate. Embedded systems including nonvolatile memory find applications in various fields such as, for example, in automotive, industry and communication market segments. Integrating nonvolatile memory and logic circuitry on a single substrate may help to improve performance and reduce costs compared to solutions wherein nonvolatile memory and logic circuitry are provided on separate substrates, for example, due to an elimination of input/output buffers, design flexibility, lower power consumption and/or system-on-chip capability.

Types of nonvolatile memory cell architectures that have been used in embedded systems include one-transistor cells (1 T-cells) including a single gate, as well as split gate solutions such as a 1.5-transistor (1.5 T) and two-transistor (2 T) cells.

Examples of known nonvolatile memory cells include those described in U.S. Pat. Nos. 6,747,310 and 7,868,375. Nonvolatile memory cells as described in U.S. Pat. Nos. 6,747,310 and 7,868,375 include a source region and a drain region that are formed in a semiconductor substrate. Between the source region and the drain region, a channel region is provided that is doped differently than the source region and the drain region. Over the channel region, a floating gate and a select gate are provided. Over the floating gate, a control gate is provided, and an erase gate is provided over the source region. The select gate, the floating gate, the control gate and the erase gate are electrically insulated from each other and from the source, drain and channel regions by electrically insulating materials. The floating gate is surrounded by electrically insulating materials so that it is electrically floating. The source region, the drain region, the select gate, the control gate and the erase gate may have respective electrical contacts connected thereto so that voltages may be applied to the source region, the drain region and the select, control and erase gates for performing operations of programming, erasing and reading the nonvolatile memory cell.

In known nonvolatile memory cells, the select gate, the control gate, the erase gate and the floating gate may be formed of polysilicon, and silicon dioxide, silicon nitride and/or silicon oxynitride may be used for providing an electrical insulation between the select gate, the control gate, the erase gate and the floating gate, and for providing an electrical insulation between the gates and the source, drain and channel regions of the nonvolatile memory cell. In particular, an oxide-nitride-oxide layer stack may be provided between the floating gate and the control gate to enhance a capacitive coupling between the control gate and the floating gate.

For programming the nonvolatile memory cell, voltages adapted for creating a relatively strong, substantially vertically oriented electrical field in the channel region between the select gate and the floating gate and a current providing electrons to the channel region may be applied to the select and control gates and the source and drain regions, respectively, which may cause a hot electron injection into the floating gate so that the floating gate is electrically charged. Since the floating gate is electrically floating, the charge injected into the floating gate may remain in the floating gate and may create an electric field that acts on a portion of the channel region below the floating gate.

For reading data from the nonvolatile memory cell, a voltage may be applied between the source region and the drain region, and a voltage adapted for creating an electrically conductive channel below the select gate may be applied to the select gate. Due to the influence of the electric charge in the floating gate on the portion of the channel region below the floating gate, a current flowing between the source region and the drain region may be influenced by the electric charge on the floating gate. Thus, it may be determined if an electric charge has been injected into the floating gate by means of a programming operation.

For erasing the nonvolatile memory cell, a relatively high positive voltage may be applied to the erase gate so that a Fowler-Nordheim tunneling of electrons from the floating gate to the erase gate may be obtained. Thus, an electric charge injected into the floating gate in the programming of the nonvolatile memory cell may be removed from the floating gate.

Nonvolatile memory cells as described above have been implemented in the 40 nm technology node. However, implementing nonvolatile memory cells in smaller technology nodes, for example in the 28 nm technology node, may have issues associated therewith, in particular when logic transistors provided on the same substrate are formed in accordance with a gate-first high-k metal gate (HKMG) technology, and wherein HKMG gates including a high-k dielectric material and a metal layer are to be provided also in the nonvolatile memory cells. Metal layers provided in gates formed in accordance with HKMG technology may be susceptible to etching by commonly used cleaning chemistries. For avoiding that the metal layer is adversely affected by cleaning processes, it is desirable to encapsulate the metal layer in the gates after gate patterning, wherein the metal layer stays encapsulated during all subsequent process steps. Additionally, not removed and not encapsulated high-k metal gate residuals might possibly cause fab contamination problems later in the process flow.

When HKMG gates in nonvolatile memory cells and HKMG gates of logic transistors are formed by means of common deposition and patterning processes, achieving a complete removal of HKMG layers in the patterning of gates of nonvolatile memory cells and ensuring an encapsulation of the metal layers in the gates of both the nonvolatile memory cells and the logic transistors may be an issue since, due to the relatively complex structure of the nonvolatile memory cells, there may be a relatively high topography of the nonvolatile memory cells.

The present disclosure provides semiconductor structures and methods for the formation thereof that may help to substantially avoid or at least reduce issues relating to the formation of nonvolatile memory cells including gates that are formed in accordance with high-k metal gate technology.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein is directed to integrated circuits including nonvolatile memory devices. One illustrative semiconductor structure disclosed herein includes, among other things, a plurality of pairs of nonvolatile memory cells arranged in a row, an edge cell positioned adjacent to the plurality of pairs of nonvolatile memory cells, and a first gate, a second gate, a third gate, and a fourth gate. Additionally, each pair of the nonvolatile memory cells includes a first nonvolatile memory cell and a second nonvolatile memory cell. Furthermore, the first gate and the second gate extend across each of the first nonvolatile memory cells, wherein the second gate partially overlaps the first gate, and the third gate and the fourth gate extend across each of the second nonvolatile memory cells, wherein the fourth gate partially overlaps the third gate. Moreover, each of the first gate, the second gate, the third gate, and the fourth gate has an end portion that is positioned in the edge cell, wherein the edge cell comprises a protection layer that is positioned over the end portions of each of the first gate, the second gate, the third gate, and the fourth gate, and the protection layer covers an end face of the second gate and an end face of the fourth gate.

In another illustrative embodiment, a semiconductor structure includes a pair of nonvolatile memory cells and an edge cell positioned adjacent to the pair of nonvolatile memory cells, wherein the pair of nonvolatile memory cells includes first and second nonvolatile memory cells. The exemplary semiconductor structure also includes a first gate extending across the first nonvolatile memory cell and into the edge cell, wherein the first gate includes a first control gate of the first nonvolatile memory cell and has a first end portion that is positioned in the edge cell, and the edge cell includes a protection layer that is positioned over the first end portion. A second gate partially overlaps the first gate and extends across the first nonvolatile memory cell and into the edge cell, wherein the second gate includes a first select gate of the first nonvolatile memory cell and has a second end portion that is positioned in the edge cell, and the protection layer is positioned over the second end portion and covers an end face of the second gate. The semiconductor structure further includes a third gate extending across the second nonvolatile memory cell and into the edge cell, wherein the third gate includes a second control gate of the second nonvolatile memory cell and has a third end portion that is positioned in the edge cell, and the protection layer is positioned over the third end portion. Moreover, a fourth gate partially overlaps the third gate and extends across the second nonvolatile memory cell and into the edge cell, wherein the fourth gate includes a second select gate of the second nonvolatile memory cell and has a fourth end portion that is positioned in the edge cell, and the protection layer is positioned over the fourth end portion and covers an end face of the fourth gate. Furthermore, the semiconductor structure also includes one or more sidewall spacers positioned adjacent to each of the second gate and the fourth gate, wherein at least one of the one or more sidewall spacers does not cover the end face of the second gate and the end face of the fourth gate, and the one or more sidewall spacers and the protection layer encapsulate at least a portion of each of the second and fourth gates.

BRIEF DESCRIPTION OF THE DRAWINGS

The disclosure may be understood by reference to the following description taken in conjunction with the accompanying drawings, in which like reference numerals identify like elements, and in which.

Figure 1:
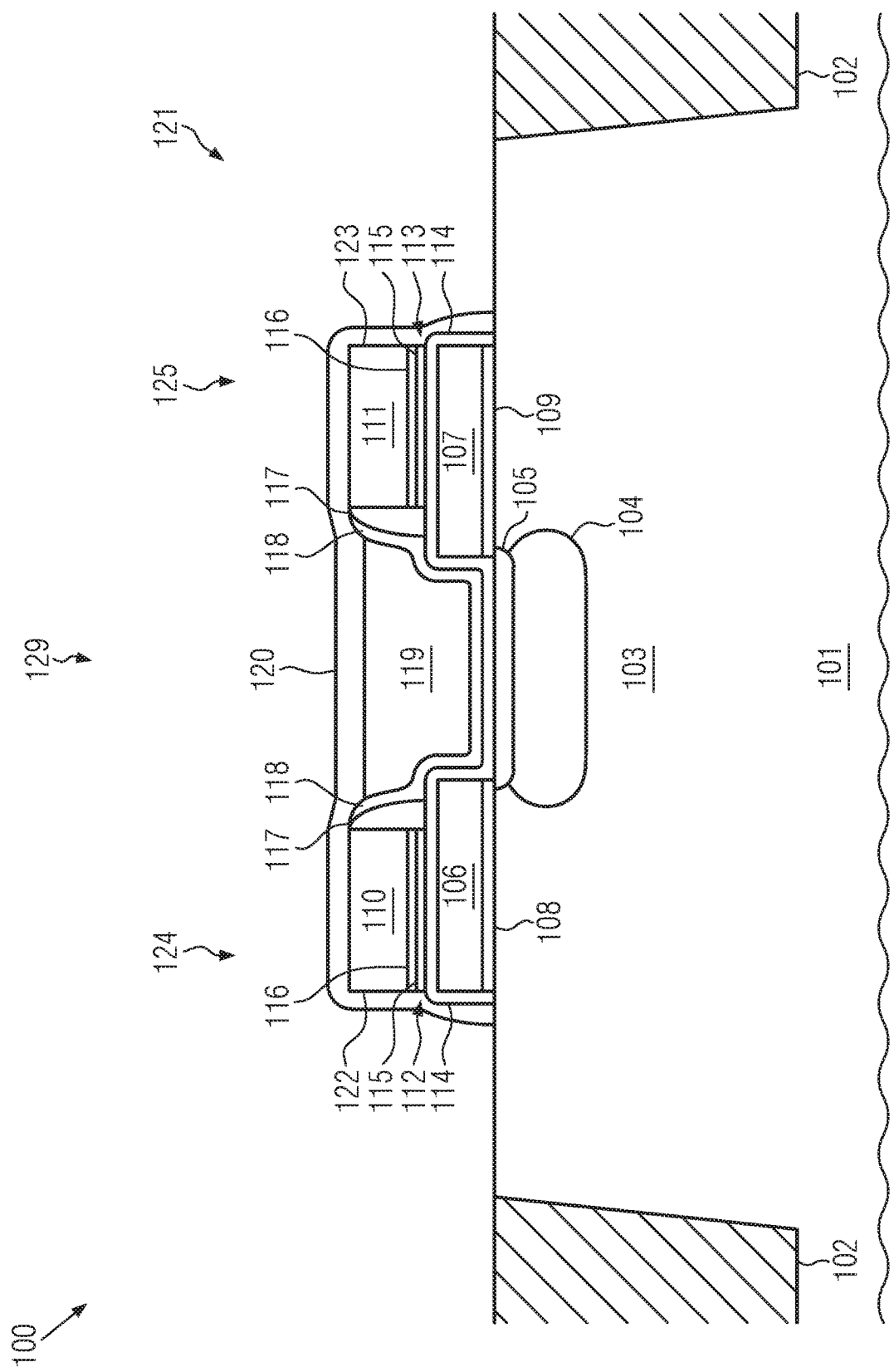
FIGS. 1, 2a, 2b, 3a-3d and 4a-4d are schematic cross-sectional views of an illustrative semiconductor structure during various stages of device manufacturing in accordance with an exemplary embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target. For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Figure 3A:
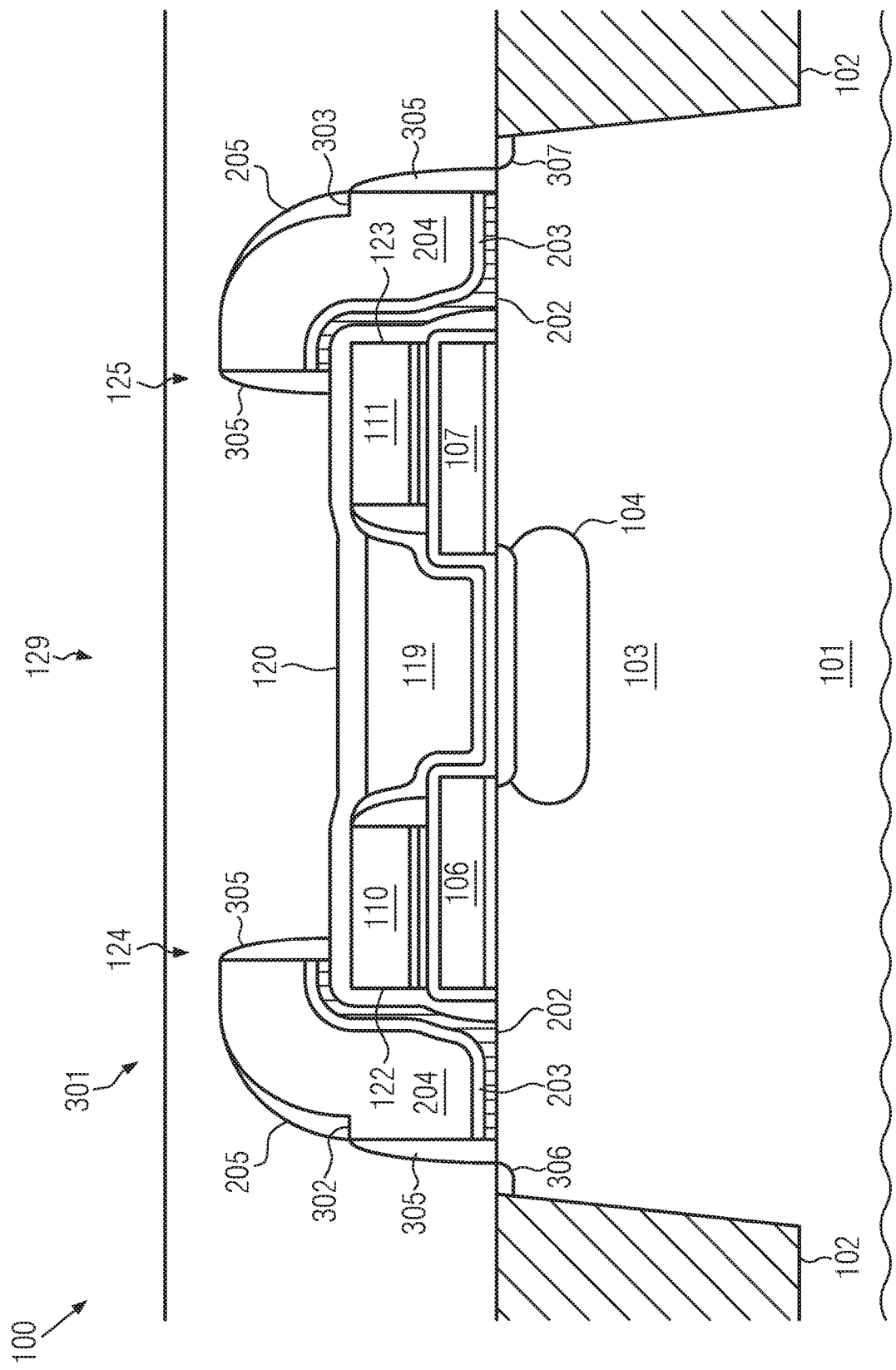

Furthermore, it should be understood that, unless otherwise specifically indicated, any relative positional or directional terms that may be used in the descriptions set forth below—such as "upper," "lower," "above," "below," "over," "under," "top," "bottom," "vertical," "horizontal," "lateral," and the like—have been included so as to provide additional clarity to the description, and should be construed in light of that term's normal and everyday meaning relative to the depiction of the components or elements in the referenced figures. For example, referring to the cross-sectional view of the in-process device depicted in FIG. 1, it should be understood that the floating gates 106, 107 depicted as being positioned "above" the active region 103, and the common source region 104 is depicted as being positioned "below" the common erase gate 119. Additionally, the "top" or "upper" surface of the active region 103 as shown in FIG. 1 is depicted as being substantially "horizontally" oriented, and the select gate structure as shown in FIG. 3*a* is depicted as extending "above" the "top" or "upper" surface of the isolator layer 120.

In embodiments disclosed herein, floating gates, control gates and an erase gate of pairs of nonvolatile memory cells that are arranged in a row may be formed. Each pair of nonvolatile memory cells includes a first and a second nonvolatile memory cell. Thereafter, select gates of the nonvolatile memory cells may be formed. The select gates may be formed in accordance with gate-first high-k metal gate technology, wherein the select gates include a gate insulation layer including a high-k material and a metal layer. The select gates may partially overlap the control gates so that each select gate includes a first part over a control gate and a second part over a portion of a substrate of the semiconductor structure adjacent the control gate.

The select gates and gates of logic transistors provided in the same semiconductor structure may be formed by means of common deposition processes, which are employed for forming a high-k metal gate stack, and a common patterning process wherein the select gates and the gates of the logic transistors are formed from the gate stack.

For avoiding issues related to the encapsulation of a metal layer of the high-k metal gate stack after the patterning of the gate stack and issues related to ensuring an electrical disconnection of neighboring select gates, which may be caused by the topography of the erase, floating and control gates, in embodiments disclosed herein, an edge cell may be provided adjacent the plurality of pairs of nonvolatile memory cells. In the patterning of a high-k metal gate stack from which the select gates of the nonvolatile memory cells and the gates of the logic transistors are formed, a select gate structure may be formed. The select gate structure may have a first portion at a sidewall of the control gate of the first nonvolatile memory cells of the pairs of nonvolatile memory cells that partially overlaps the control gate of the first nonvolatile memory cells, a second portion at a sidewall of the control gates of the second nonvolatile memory cells of the pairs of nonvolatile memory cells that partially overlaps the control gate of the second nonvolatile memory cells, and a third portion in the edge cell that connects the first and second portions of the select gate structure and partially overlaps the ends of the control gates and the erase gate. Thus, in the patterning of the gate stack for forming the select gate structure and the gates of the logic transistors, no free ends of the select gate structure adjacent the control gates need to be formed. After the patterning of the high-k metal gate stack, sidewall spacers may be formed at the etched flanks of the high-k metal gate stack which are on a horizontal underlying ground and may provide an encapsulation of the metal layer of the select gate structure.

Thereafter, a cut etch process may be performed, wherein sections of the select gate structure at the ends of the first and second portions of the select gate structure in the edge cell are removed. For this purpose, a photoresist mask having openings at the ends of the first and second portions of the select gate structure may be formed. Thereafter, one or more etch processes adapted for removing at least any electrically conductive material of the high-k metal gate stack may be performed for electrically disconnecting the first and second portions of the select gate structure. Thus, select gate structures of the first and second nonvolatile memory cells of the pairs of nonvolatile memory cells, which are not electrically connected to each other, may be formed.

In some embodiments, in the one or more etch processes wherein the sections of the select gate structure are removed, a portion of the erase gate may be removed from a common source region of the first and second nonvolatile memory cells of the pairs of nonvolatile memory cells for allowing a formation of source line contacts landing on the source region below the erase gate. In other embodiments, separate etch processes may be performed for forming the source contact region and for removing the sections of the select gate structure.

Since the removal of the sections of the select gate structure takes place in the edge cell, the removal of the sections of select gate structure may be performed at a location without a functional device in the neighborhood, and the etch process wherein the sections of the select gate structure are removed itself need not form a functional device. Thus, there may be a relatively large number of degrees of freedom which may be optimized for allowing an efficient removal of the materials of the high-k metal gate stack in the removal of the sections of the select gate structure.

After the removal of the sections of the select gate structure, end faces of the select gates of the first and second nonvolatile memory cells formed in the removal of the sections of the select gate structure may be sealed by means of a protection layer that is formed over the edge cell so that an adverse influence of subsequent process steps, such as, for example, cleaning processes, on the metal layer of the high-k metal gate stack may be substantially avoided or at least reduced. In some embodiments, the protection layer may be provided by a part of a nitride protection layer, sometimes referred to herein as an OP layer or an OP nitride, which may also be used for providing a silicide block layer. In the patterning of the OP nitride, the OP nitride may remain on the surface of the semiconductor structure in a wider neighborhood of the portions of the semiconductor structure from which the sections of the select gate structure were removed for improving an encapsulation of the select gates. Furthermore, in some embodiments, a semiconductor material of a semiconductor substrate of the semiconductor structure may be provided below the sections of the select gate structure that are removed for improving a robustness of the etching of the sections of the select gate structure in embodiments wherein a source contact region is simultaneously formed.

Figure 5:
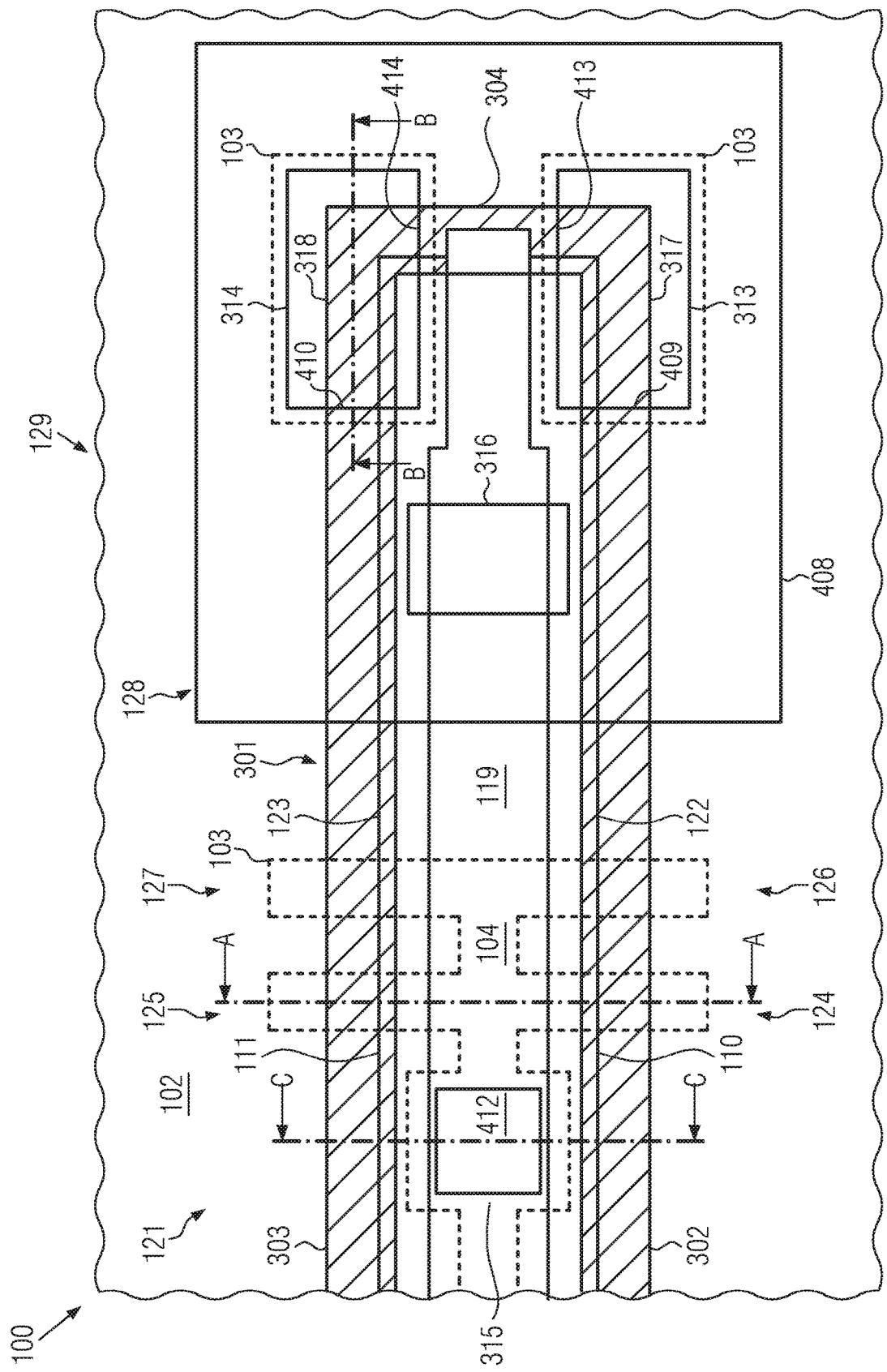
FIG. 5 schematically illustrates a layout of a nonvolatile memory region of the semiconductor structure shown in FIGS. 1, 2a, 2b, 3a-3d and 4a-4d.

FIG. 1 shows a schematic cross-sectional view of a portion of a semiconductor structure 100 according to an embodiment in a stage of a method of forming a semiconductor structure according to an embodiment. A schematic layout of the semiconductor structure 100 is shown in FIG. 5. For clarity of illustration, in FIG. 5, some details have been omitted. Furthermore, FIG. 5 shows features that are formed and/or used in different stages of the method of forming a semiconductor structure for illustrating the relative arrangement of these features. The cross-section of FIG. 1 is along the line A-A shown in FIG. 5.

The semiconductor structure 100 includes a substrate 101. The substrate 101 may include a bulk semiconductor substrate, for example, a wafer of a semiconductor material, such as silicon. In other embodiments, the substrate 101 may include a semiconductor-on-insulator substrate including a semiconductor layer, for example, a silicon layer, at which circuit elements of the semiconductor structure 100, such as transistors and nonvolatile memory cells, are formed, which is provided over a layer of an electrically insulating material, such as silicon dioxide, that separates the layer of the semiconductor material from a support substrate, which may be a semiconductor wafer, for example, a silicon wafer.

The semiconductor structure 100 may include a trench isolation structure 102 provided in the substrate 101. The trench isolation structure 102 may provide an electrical insulation between portions of an active region 103 that is provided in the semiconductor material of the substrate 101.

The semiconductor structure 100 may include a nonvolatile memory region 129. In the nonvolatile memory region 129, portions of the active region 103 at which nonvolatile memory cells 124, 125, 126, 127 having a common source region 104 to which electrical connection may be made by means of a source contact region 412 are formed may be provided. The source region 104 may be doped, for example N-doped. As can be seen from FIG. 5, pairs of the nonvolatile memory cells 124, 125, 126, 127 may be arranged in a row along a direction corresponding to the horizontal direction of FIG. 5, which is perpendicular to the plane of drawing of FIG. 1. The nonvolatile memory cells 124, 125 form a first pair of nonvolatile memory cells, and the nonvolatile memory cells 126, 127 form a second pair of nonvolatile memory cells. FIG. 1 shows a schematic cross-section of a portion of the nonvolatile memory cell region 129 wherein the nonvolatile memory cells 124, 125 are formed. Other pairs of nonvolatile memory cells, for example, the pair of nonvolatile memory cells 126, 127, may have a configuration corresponding to the configuration of the pair of nonvolatile memory cells 124, 125.

The number of the nonvolatile memory cells 124, 125, 126, 127 shown in FIG. 5 is of an illustrative nature only. In some embodiments, the number of pairs of nonvolatile memory cells in a row of pairs of nonvolatile memory cells may be substantially greater than two. Furthermore, a plurality of rows of nonvolatile memory cells having a configuration corresponding to that shown in FIG. 5 may be provided so that the nonvolatile memory cell region 129 includes an array of nonvolatile memory cells. Adjacent each row of pairs of nonvolatile memory cells, an edge cell 128 may be provided. In the edge cell, two portions of the active region 103 may be provided. In the rest of the edge cell, the trench isolation structure 102 may be provided.

The semiconductor structure 100 may include a gate structure arrangement 121. The gate structure arrangement 121 may include a floating gate 106 of the nonvolatile memory cell 124 and a floating gate 107 of the nonvolatile memory cell 125. Each of the floating gates 106, 107 may include a floating gate electrode which may be formed of a semiconductor material such as, for example, polysilicon that is separated from the active region 103 by a floating gate insulation layer. In FIG. 1, the floating gate insulation layer of the floating gate 106 is denoted by reference numeral 108, and the floating gate insulation layer of the floating gate 107 is denoted by reference numeral 109. Over the floating gate 106, a control gate 110 of the nonvolatile memory cells 124, 126 may be provided, which may include a control gate electrode formed of a semiconductor material such as, for example, polysilicon which is electrically insulated from the floating gate 106 by a control gate insulation layer 112. In some embodiments, the control gate insulation layer 112 may include an oxide-nitride-oxide (ONO) layer stack including a sublayer 114 of silicon dioxide, a sublayer 115 of silicon nitride over the sublayer 114 and a sublayer 116 of silicon dioxide over the sublayer 115.

Over the floating gate 107, a control gate 111 of the nonvolatile memory cells 125, 127 may be provided, which may include a control gate electrode formed of a semiconductor material such as, for example, polysilicon and a control gate insulation layer 113, which may include the sublayers 114, 115, 116 formed of silicon dioxide, silicon nitride and silicon dioxide, respectively. As can be seen from FIG. 1, the sublayer 114 of the control gate insulation layers 112, 113 may also be provided at sidewalls of the floating gates 106, 107 so that the floating gate electrodes thereof are surrounded by electrically insulating material and are electrically floating.

The gate structure arrangement 121 may include a sidewall 122, which may include sidewalls of a gate structure provided by the control gate 110 and the floating gate 106 at a side of the control gate 110 and the floating gate 106 opposite the control gate 111 and the floating gate 107. Similarly, the gate structure arrangement 121 may include a sidewall 123 at a side of a gate structure provided by the control gate 111 and the floating gate 107 opposite the control gate 110 and the floating gate 106. At a side of the control gate 110 facing the control gate 111, and at a side of the control gate 111 facing the control gate 110, a sidewall spacer 117, which may include silicon dioxide, may be provided. Between the control gates 110, 111 and the floating gates 106, 107, a common erase gate 119 of the nonvolatile memory cells 124, 125, 126, 127 may be provided. The erase gate 119 may be separated from the source region 104 by an erase gate insulation layer 118 and, optionally, by the sublayer 114 of the control gate insulation layers 112, 113 and by a silicon dioxide region 105 which may be formed by techniques of local oxidation of silicon (LOCOS).

The above-described features of the semiconductor structure 100 may be formed by means of known techniques for the formation of semiconductor structures including techniques of photolithography, etching, deposition, oxidation and ion implantation. In some embodiments, techniques as described in U.S. patent application Ser. No. 14/982,228, filed on Dec. 29, 2015, the disclosure of which is incorporated herein by reference, may be employed in the formation of the semiconductor structure 100.

Over the control gates 110, 111 and the erase gate 119, an isolator layer 120 may be provided. In some embodiments, the isolator layer 120 may include silicon dioxide, and it may have a thickness of about 20 nm for providing a sufficient electrical insulation at voltage differences of about 10 V which can occur in the operation of the nonvolatile memory cells 124, 125, 126, 127. In some embodiments, the isolator layer 120 may be formed by means of a high temperature oxidation process. In other embodiments, different materials may be used for the isolator layer 120, for example, silicon nitride. Furthermore, in some embodiments wherein the isolator layer 120 includes silicon dioxide, the isolator layer 120 may be formed by means of deposition processes, such as chemical vapor deposition and/or plasma-enhanced chemical vapor deposition, instead of an oxidation process.

As can be seen from the layout shown in FIG. 5, the control gate 110 may be a common control gate of the nonvolatile memory cells 124, 126, and the control gate 111 may be a common control gate of the nonvolatile memory cells 125, 127. However, the floating gates 106, 107 of the nonvolatile memory cells 124, 125 may be separated from the floating gates of the nonvolatile memory cells 126, 127 by layers of electrically insulating material such as, for example, silicon dioxide and/or silicon nitride.

The erase gate 119 may be a common erase gate for each of the nonvolatile memory cells 124, 125, 126, 127 in the row of pairs of the nonvolatile memory cells shown in FIG. 5.

End portions of the control gates 110, 111 and the erase gate 119 may extend into the edge cell 128 adjacent the pairs of nonvolatile memory cells. At the end of the erase gate 119, a portion of the erase gate 119 having a smaller width than the portion of the erase gate 119 in the nonvolatile memory cells 124, 125, 126, 127 may be provided, as shown in FIG. 5.

Figure 2A:
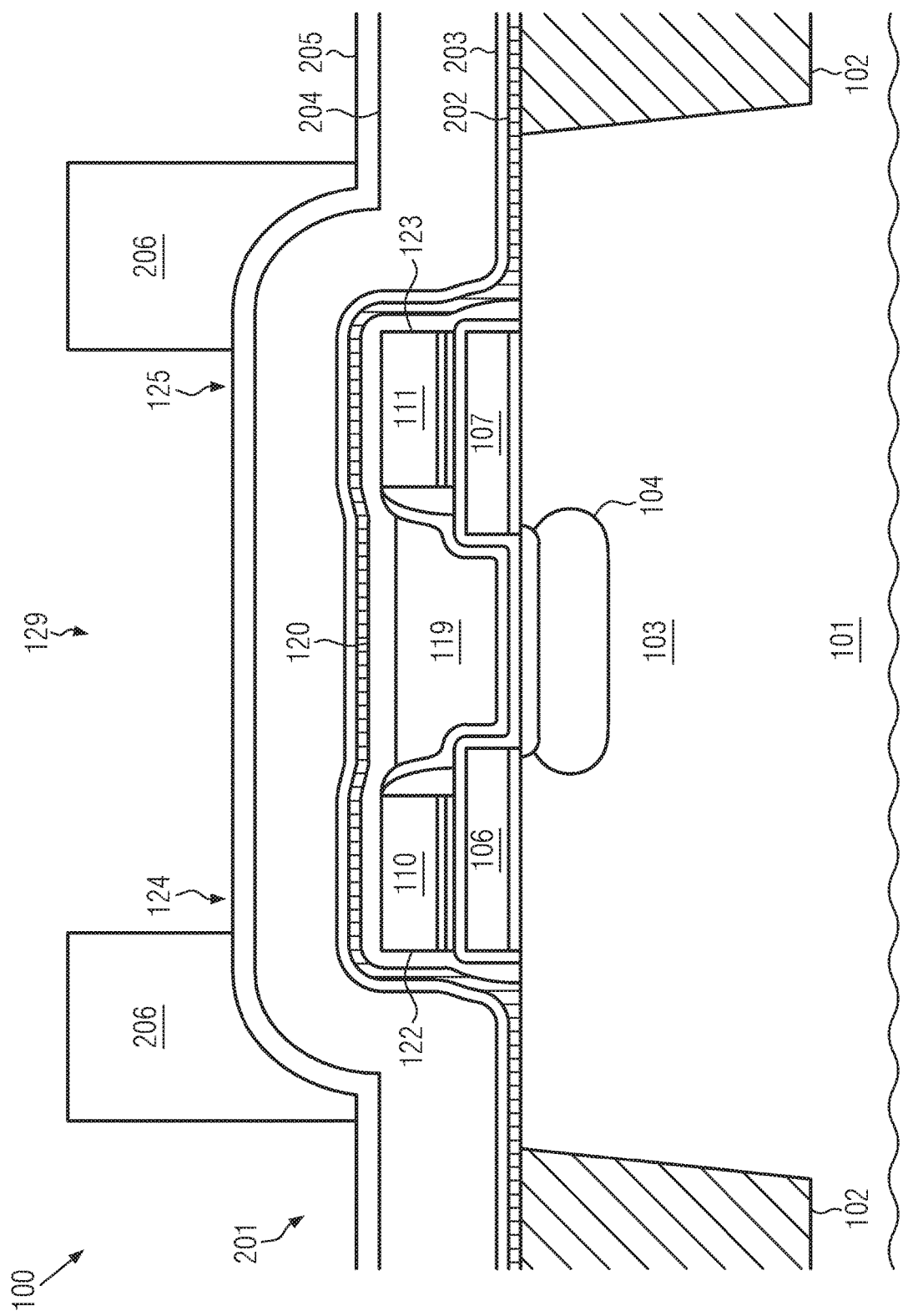
Figure 2B:
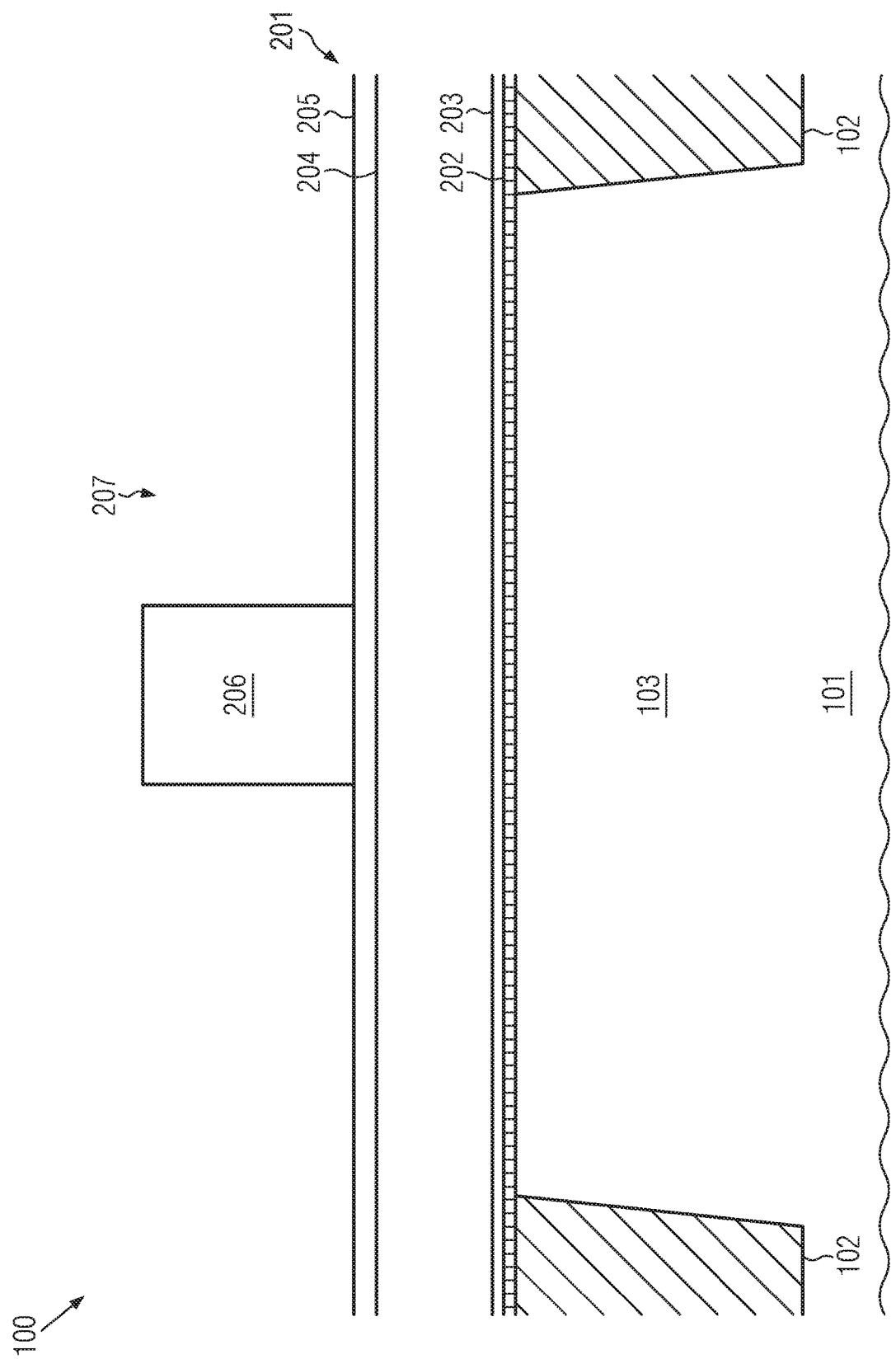

FIGS. 2a and 2b show schematic cross-sectional views of the semiconductor structure 100 in a later stage of the method. FIG. 2a is a cross-sectional view along the line A-A of FIG. 5 corresponding to the cross-section of FIG. 1. FIG. 2b is a cross-sectional view of a logic transistor region 207 wherein a logic transistor, which may be a part of a logic circuit formed at the semiconductor structure 100, is formed. The logic transistor region 207 includes a portion of the active region 103 wherein source, channel and drain regions of the logic transistor are formed. The trench isolation structure 102 may provide electrical insulation between the transistor formed at the logic transistor region 207 and other circuit elements that are formed at the semiconductor structure 100.

After the formation of the components of the nonvolatile memory cells 124 to 127 described above with reference to FIG. 1, a gate stack 201 may be deposited. The gate stack 201 may include a layer 202 of a gate insulation material and gate electrode material layers 203, 204. The layer 202 of gate insulation material may include a high-k dielectric material having a dielectric constant that is greater than the dielectric constant of silicon dioxide, such as, for example, hafnium dioxide, zirconium dioxide, hafnium silicon oxynitride, zirconium silicon oxynitride and/or hafnium zirconium oxide. In some embodiments, in addition to the high-k material, the layer 202 of gate insulation material may include one or more other dielectric materials, for example, a relatively thin pad layer of silicon dioxide that is provided below the layer of the high-k material. The layer 203 may be a metal layer that includes a metal having a workfunction that matches the workfunction of the semiconductor material in the active region 103 in accordance with the transistor type of the nonvolatile memory cells 124 to 127 and the logic transistor to be formed in the transistor region 207. In embodiments wherein the nonvolatile memory cells 124 to 127 and the logic transistor to be formed in the logic transistor region 207 are N-channel transistors, the metal layer 203 may include a workfunction adjustment material suitable for N-channel field effect transistors, such as, for example, lanthanum, lanthanum nitride and/or titanium nitride.

The layer 204 may be a polysilicon layer which may include doped polysilicon. In some embodiments, the gate stack 201 may additionally include a capping layer 205, for example, a silicon nitride layer, which may be formed over the polysilicon layer 204. For forming the layers 202, 203, 204, 205 of the gate stack 201, deposition techniques such as atomic layer deposition, physical vapor deposition, chemical vapor deposition and/or plasma-enhanced chemical vapor deposition may be used in accordance with known techniques that are used for the formation of gate stacks employed in gate-first high-k metal gate technology.

After the formation of the gate stack 201, the gate stack 201 may be patterned for forming a select gate structure 301 (see FIGS. 3a, 3c, 3d and 5) that is used for providing select gates of the nonvolatile memory cells 124 to 127. Additionally, the patterning of the gate stack 201 may form a gate 308 of the logic transistor formed in the logic transistor region 207 (see FIG. 3b).

The patterning of the gate stack 201 may include a formation of a mask 206 over the gate stack 201. The mask 206 may include a photoresist mask. Additional layers, such as an optical planarization layer and/or an anti-reflective coating, may also be provided. The mask 206 may cover portions of the semiconductor structure 100 at which the select gate structure 301 and the gate 308 of the logic transistor are to be formed.

Figure 3B:
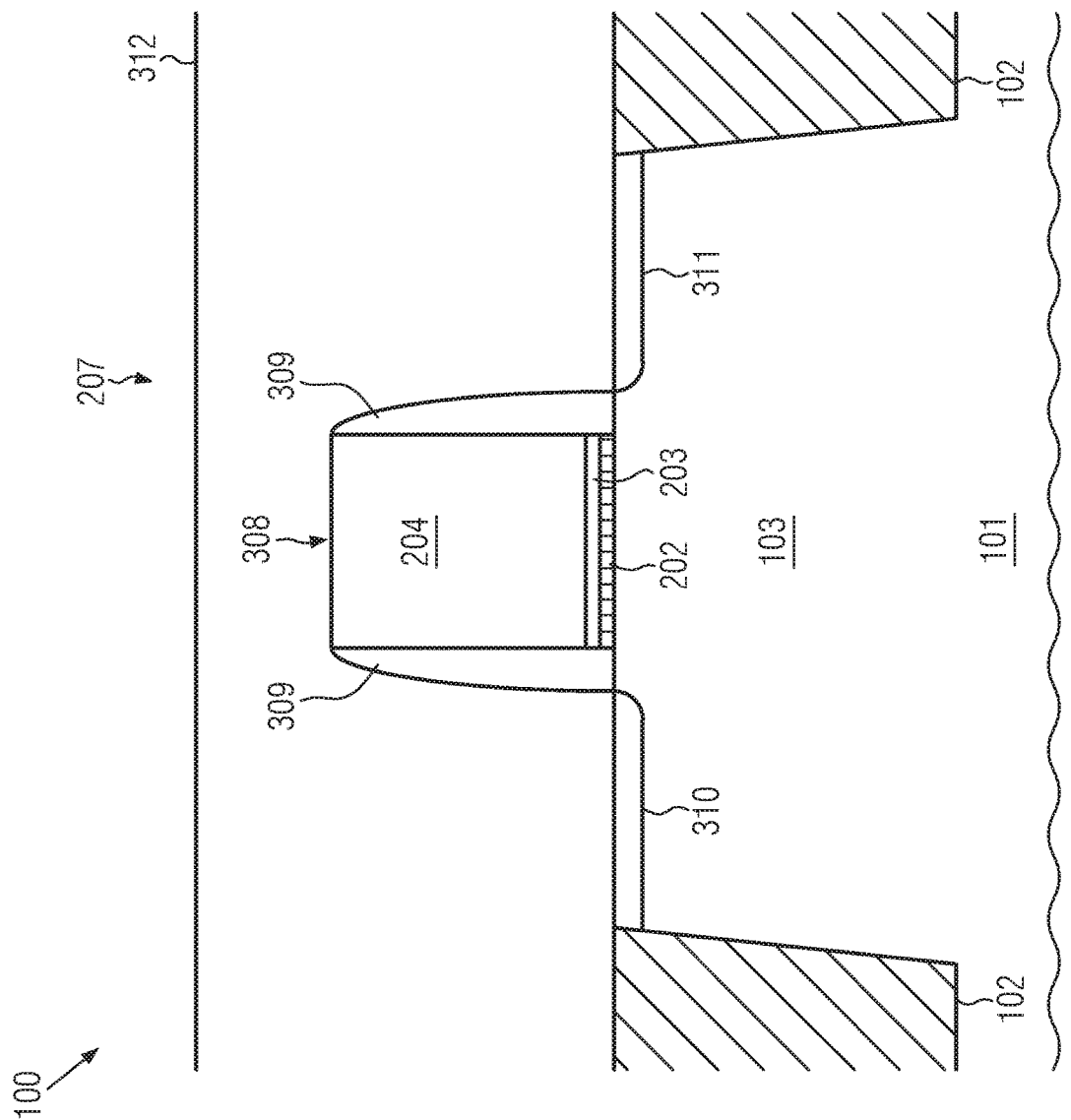
Figure 3C:
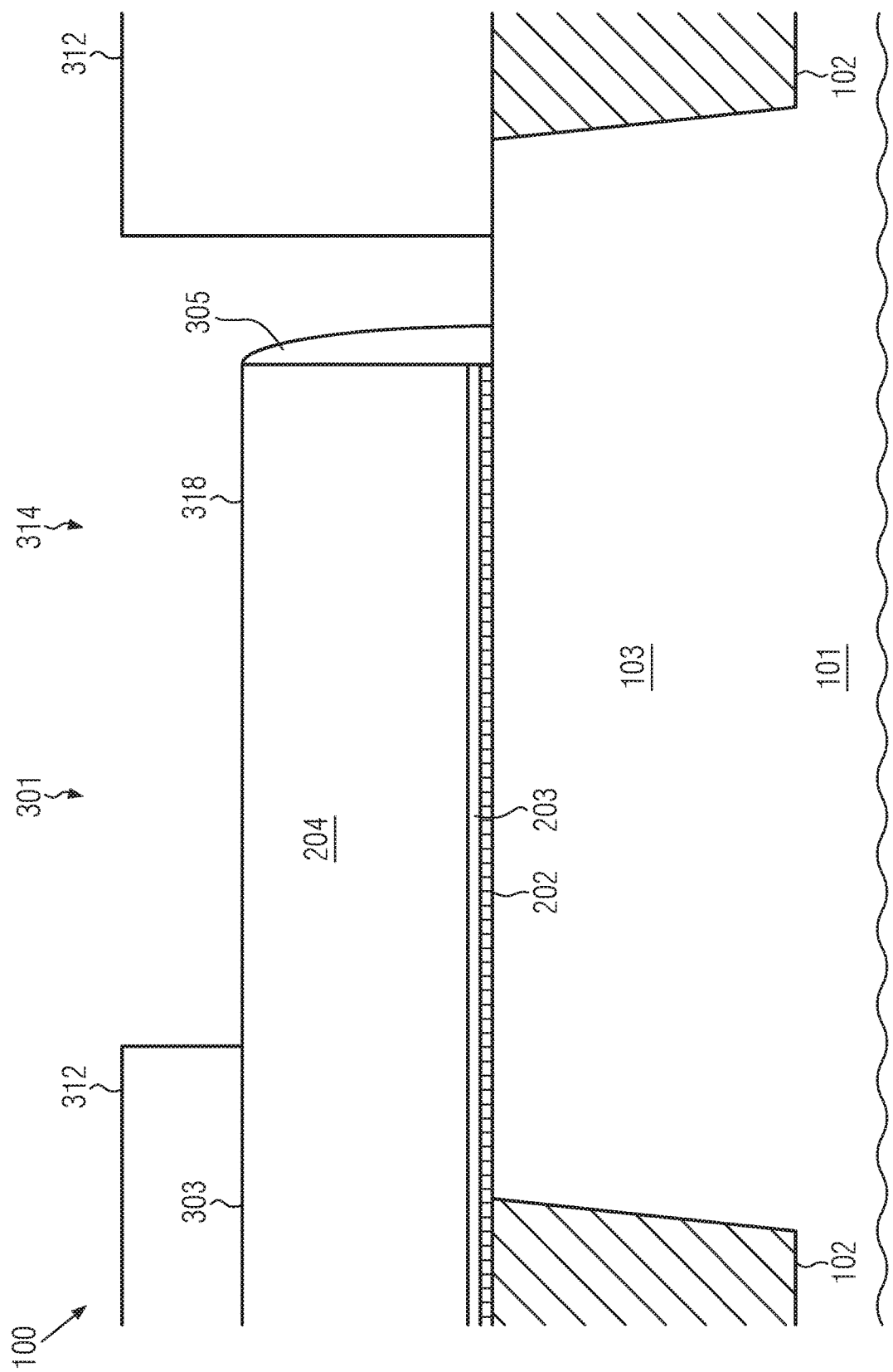
Figure 3D:
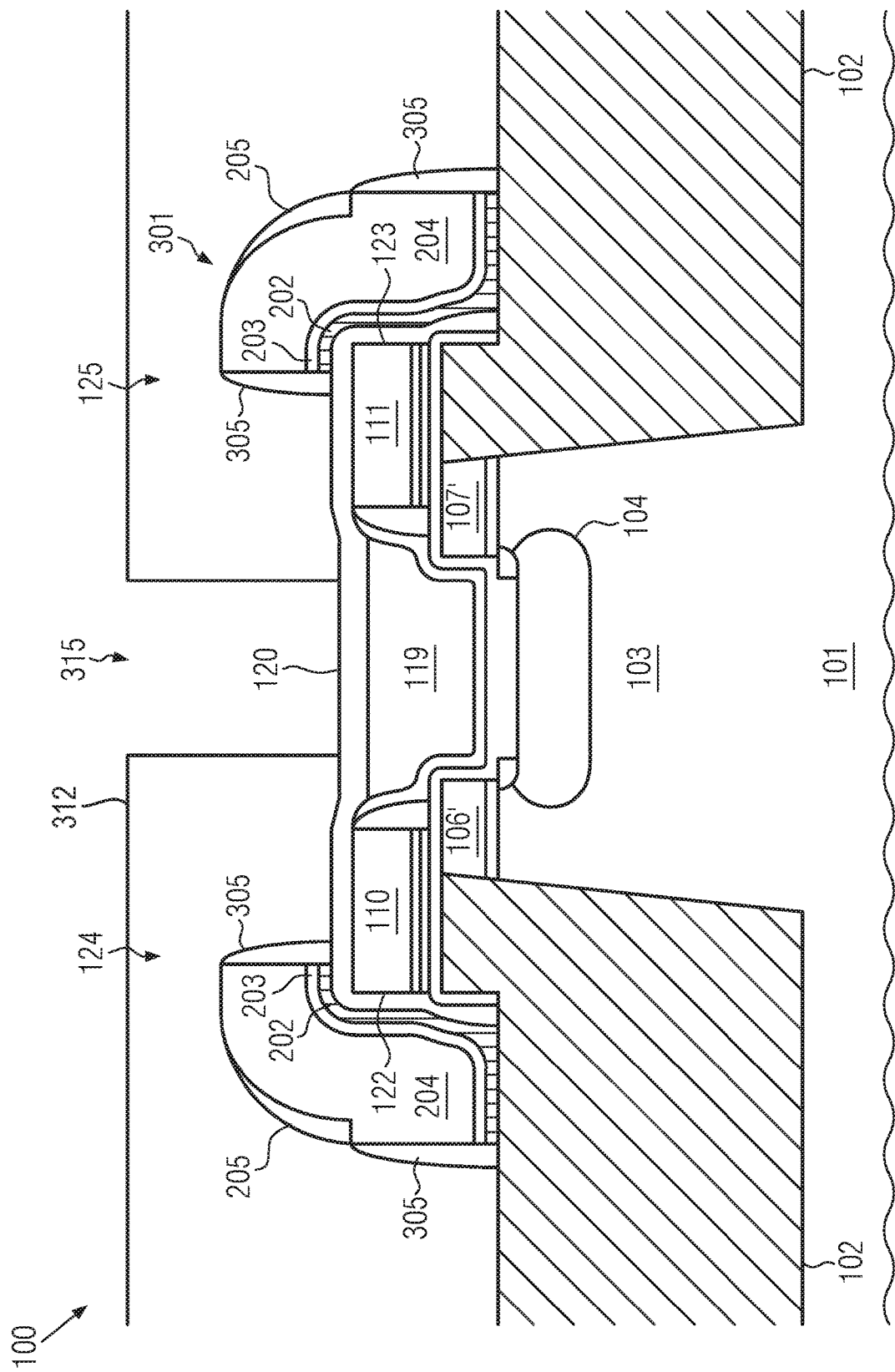

FIGS. 3a, 3b, 3c and 3d show schematic cross-sectional views of the semiconductor structure 100 at a later stage of the method. FIG. 3a is a cross-sectional view along the line A-A shown in FIG. 5, corresponding to the cross-section of FIGS. 1 and 2a, and FIG. 3b is a cross-sectional view of the logic transistor region 207, corresponding to the cross-section of FIG. 2b. FIG. 3c shows a cross-section along the line B-B in FIG. 5, which extends through one of the portions of the active region 103 in the edge cell 128. Components of the nonvolatile memory region 129 at the other portion of the active region 103 in the edge cell 128 may have features corresponding to those described in the following with reference to FIG. 3c. FIG. 3d shows a cross-section of the nonvolatile memory region 129 along the line C-C shown in FIG. 5, which extends through a portion of the nonvolatile memory region 129 wherein the source contact region 412 is provided.

As shown in FIG. 3d, in the portion of the nonvolatile memory region 129 wherein the source contact region 412 is provided, the active region 103 may have an extension in a direction perpendicular to the longitudinal direction of the row of pairs of nonvolatile memory cells (vertical in the view of FIG. 5), which is smaller than the corresponding extension of the active region 103 in the pairs of nonvolatile memory cells and greater than the corresponding extension of the active region 103 in portions of the nonvolatile memory region 129 between the pairs of nonvolatile memory cells wherein only the common source region 104 of the nonvolatile memory cells 124 to 127 is provided. Furthermore, components having a configuration similar to the floating gates 106, 107 may be provided adjacent the source contact region 412 which, however, may have a smaller extension in the direction perpendicular to the longitudinal direction of the row of pairs of nonvolatile memory cells than the floating gates 106, 107. Instead, portions of the trench isolation structure 102 may be provided below the control gates 110, 111, wherein a greater height of the trench isolation structure 102 may be provided below the control gates 110, 111 to reduce the topography below the control gates 110, 111.

The patterning of the gate stack 201 may include one or more etch processes that are performed after the formation of the mask 206 and which are adapted to remove the materials of the capping layer 205, the polysilicon layer 204, the metal layer 203 and the layer 202 of the gate insulation material. In some embodiments, the one or more etch processes may include a first etch process adapted for selectively removing the material of the capping layer 205, and which may be used for forming a hardmask on the basis of the capping layer 205. Thereafter, the mask 206 may be removed by means of a photoresist strip process, and one or more further etch processes adapted for selectively removing the materials of the polysilicon layer 204, the metal layer 203 and the layer 202 of gate insulation material relative to the material of the capping layer 205 may be performed. Thus, the gate structure 301 in the nonvolatile memory region 129 and the gate 308 of the logic transistor formed in the logic transistor region 207 may be formed on the basis of the gate stack 201. In some embodiments, portions of the capping layer 205 over substantially horizontal portions of the select gate structure 301 and the gate 308 of the logic transistor may also be removed, for example, by means of an etch process adapted for selectively removing the material of the capping layer 205 relative to polysilicon. Portions of the capping layer 205 at inclined portions of the select gate structure 301 may remain in the semiconductor structure 100, as shown in FIGS. 3a and 3d.

As shown in FIGS. 3a, 3d and 5, the select gate structure 301 may partially overlap the control gates 110, 111 as well as the end of the erase gate 119 in the edge cell 128.

The select gate structure 301 may include a portion 302 at the sidewall 122 of the gate structure arrangement 121 and a portion 303 at the sidewall 123 of the gate structure arrangement 121. The portion 302 of the select gate structure 301 may include a first part over the control gate 110 and a second part over portions of the active region 103 and the trench isolation structure 102 in the substrate 101 adjacent the control gate 110 and the floating gates of the nonvolatile memory cells 124, 126. The portion 303 of the select gate structure 301 may include a first part over the control gate 111 and a second part over the active region 103 and the trench isolation structure 102 in the substrate 101 adjacent the control gate 111 and the floating gates of the nonvolatile memory cells 125, 127.

The portion 302 of the select gate structure 301 may provide a common select gate of the nonvolatile memory cells 124, 126, which are arranged at a first side of the erase gate 119 (below the erase gate 119 in the view of FIG. 5 and at the left side of the erase gate 119 in the view of FIGS. 3a and 3d). The portion 303 of the select gate structure 301 may provide a common select gate of the nonvolatile memory cells 125, 127 which are arranged at a second side of the erase gate 119 (above the erase gate 119 in the view of FIG. 5 and at the right side of the erase gate 119 in the view of FIGS. 3a, 3d).

In addition to the portions 302, 303, which provide select gates of the nonvolatile memory cells 124 to 127, the select gate structure 301 may include a portion 304 in the edge cell 128, which connects the portions 302, 303, and extends in a direction that is substantially perpendicular to the longitudinal direction of the row of pairs of nonvolatile memory cells (vertical in the view of FIG. 5). The portion 304 of the select gate structure 301 may partially overlap the end portions of the control gates 110, 111 and the erase gate 119 in the edge cell 128 so that the portion 304 of the select gate structure 301 includes a first part over the control gates 110, 111 and the erase gate 119 of the gate structure arrangement 121 and a second part over the active region 103 and the trench isolation structure 102 in the substrate 101 adjacent the gate structure arrangement 121.

Since the portion 304 of the select gate structure 301 in the edge cell 128 connects the portions 302, 303, after the patterning of the gate stack 201, the edge cell 128 may include portions of the select gate structure 301 having substantially a U-shape. A section 317 of the select gate structure 301 wherein the portion 302 of the select gate structure 301 adjoins the portion 304 and a section 318 where the portion 303 of the select gate structure 301 adjoins the portion 304 may be provided over portions of the active region 103 in the edge cell 128. Other parts of the select gate structure 301 in the edge cell 128 may be provided over the trench isolation structure 102. In other embodiments, the portions of the active region 103 in the edge cell 128 may be omitted and the portions of the select gate structure 301 in the edge cell 128 may be completely provided over the trench isolation structure 102.

At an end of the row of the plurality of pairs of nonvolatile memory cells opposite the edge cell 128, another edge cell having a configuration that is approximately mirror-symmetrical to the configuration of the edge cell 128 may be provided so that, after the patterning of the gate stack 201, the select gate structure 301 has substantially a ring-shape. Thus, after the patterning of the gate stack 201, an inner etched flank of the select gate structure 301 may be provided over the control gates 110, 111 and the erase gate 119, and an outer etched flank of the select gate structure 301 may be provided over the active region 103 and the trench isolation structure 102 in the substrate 101. Thus, the etched flanks of the select gate structure 301 may be provided over substantially horizontal underlying ground. This may help to substantially avoid or at least reduce issues relating to the removal of the gate stack 201, such as residues of the gate stack adjacent the select gate structure 301 remaining in the semiconductor structure 100. Thus, fab contamination problems and/or electric short circuits caused by residues of the gate stack 201 may be substantially avoided or at least reduced.

After the patterning of the gate stack 201, a sidewall spacer 305 may be formed adjacent the select gate structure 301. Additionally, a sidewall spacer 309 may be formed adjacent the gate structure 308 of the logic transistor that is formed in the logic transistor region 207. For forming the sidewall spacers 305, 309, a layer of a sidewall spacer material such as, for example, silicon nitride may be substantially isotropically deposited over the semiconductor structure 100. Thereafter, an anisotropic etch process adapted for removing the sidewall spacer material may be performed, wherein portions of the layer of sidewall spacer material over substantially horizontal portions of the semiconductor structure 100 are removed. Portions of the layer of the sidewall spacer material at the flanks of the select gate structure 301 and the gate 308 of the logic transistor may remain in the semiconductor structure 100 and form the sidewall spacers 305, 309. In some embodiments, the sidewall spacers 305, 309 may include portions that are formed of different materials, such as, for example, silicon nitride and silicon dioxide.

The sidewall spacers 305, 309 may encapsulate the layer 202 of select gate insulation material and the metal layer 203 at the flanks of the select gate structure 301 and the gate 308 of the logic transistor. Thus, the layer 202 of select gate insulation material and the metal layer 203 may be substantially completely encapsulated by the sidewall spacers 305, 309 and the polysilicon layer 204 so that a contact between the layer 202 of select gate insulation material and the metal layer 203 with cleaning agents in cleaning processes that may be performed after the formation of the sidewall spacers 305, 309 may be substantially avoided.

After the formation of the sidewall spacers 305, 309, an ion implantation process, wherein ions of a dopant, for example, an N-type dopant such as phosphorous or arsenic, are implanted into the semiconductor structure 100, may be performed. In the ion implantation process, drain extensions 306, 307 may be formed in portions of the active region 103 adjacent the select gate structure 301. Additionally, a source extension 310 and a drain extension 311 may be formed in portions of the active region 103 in the transistor region 207 adjacent the gate 308 of the logic transistor.

Additionally, an ion implantation process wherein ions of a P-type dopant, such as boron, are implanted into the semiconductor structure 100 may be performed. In this ion implantation process, source and drain extensions of P-channel transistors (not shown) in the semiconductor structure 100 may be formed. During each of the ion implantation processes, portions of the semiconductor structure 100 wherein no ions are to be implanted may be covered by a photoresist mask (not shown).

After the formation of the drain extensions 306, 307 in the nonvolatile memory region 129 and the source extension 310 and the drain extension 311 in the transistor region 207, a mask 312 may be formed over the semiconductor structure 100. The mask 312 may include a photoresist mask. Alternatively, a hardmask may be employed. The mask 312 may have openings 313, 314 (see FIGS. 5 and 3c) over the sections 317, 318 of the select gate structure 301 where the portion 302 of the select gate structure 301 adjoins the portion 304 and the portion 303 of the select gate structure 301 adjoins the portion 304. The openings 313, 314 may be provided over the portions of the active region 103 in the edge cell 128. Additionally, the mask 312 may have an opening 315 at a portion of the semiconductor structure 100 where the source contact region 412 is formed. Furthermore, an opening 316 of the mask 312 over a portion of the erase gate 119 in the edge cell 128 that is to be removed for electrically disconnecting portions of the erase gate 119 in the nonvolatile memory cells 124 to 127 from the outer edge cell may be provided.

Figure 4A:
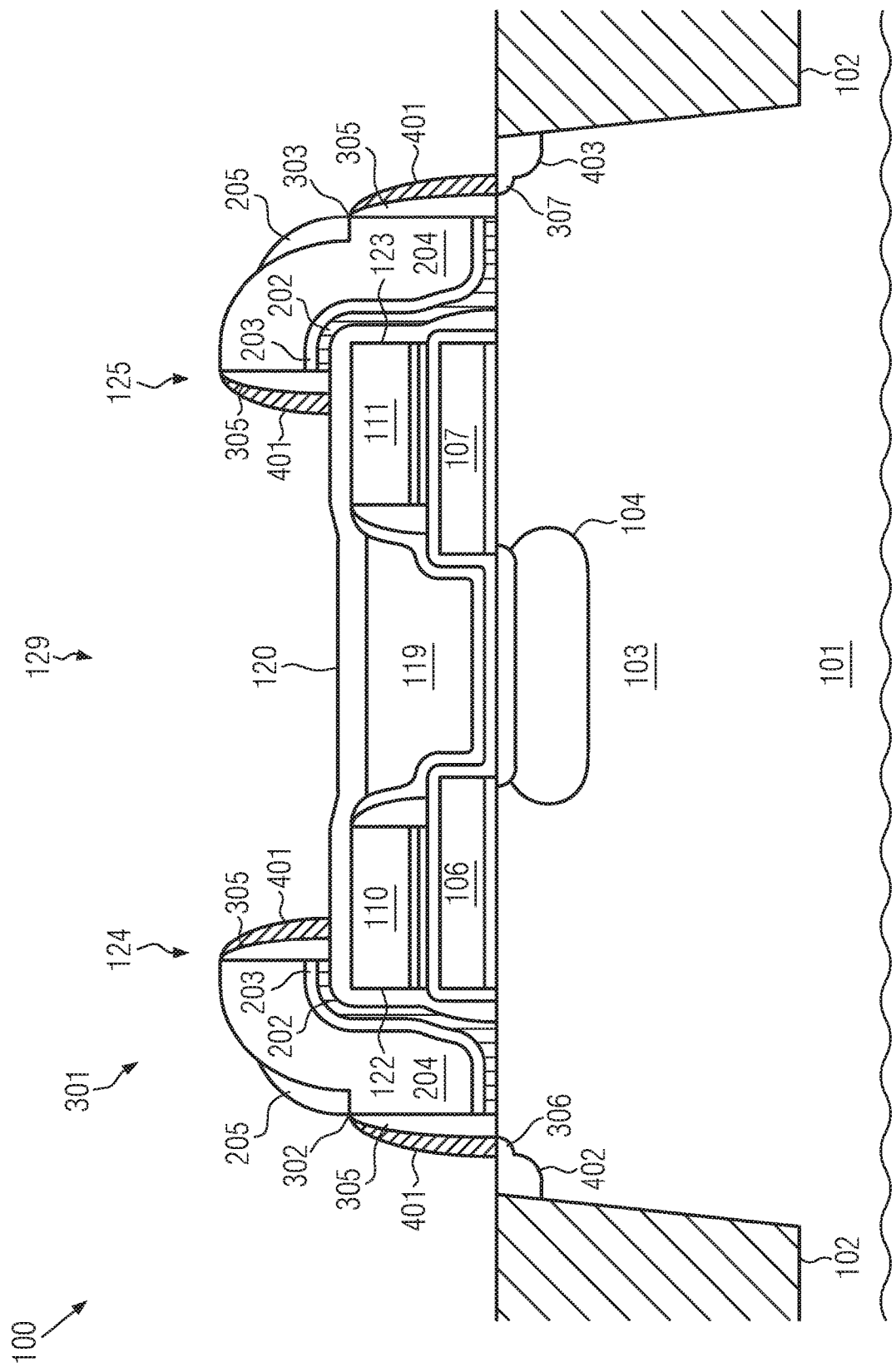
Figure 4B:
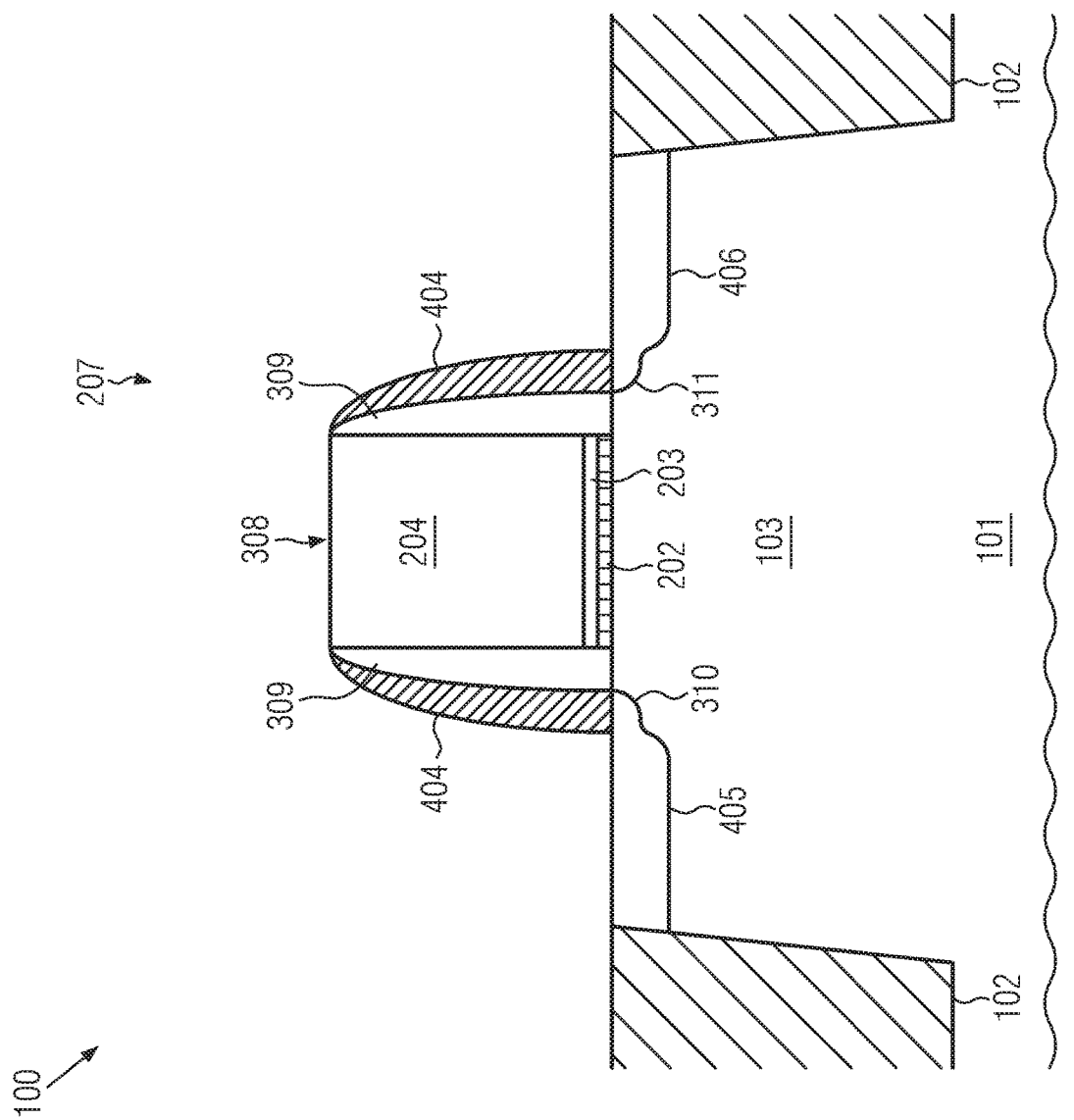
Figure 4C:
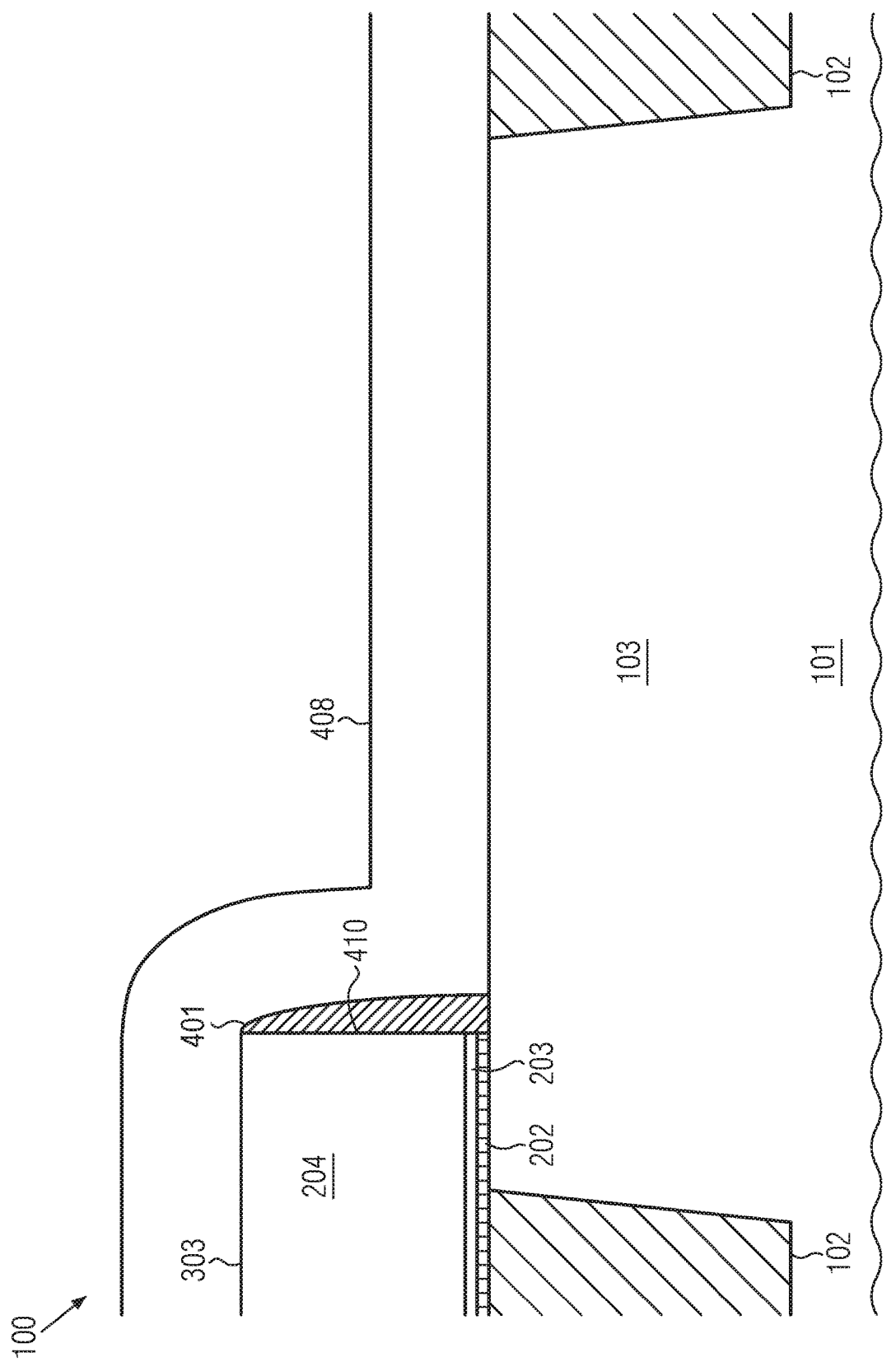
Figure 4D:
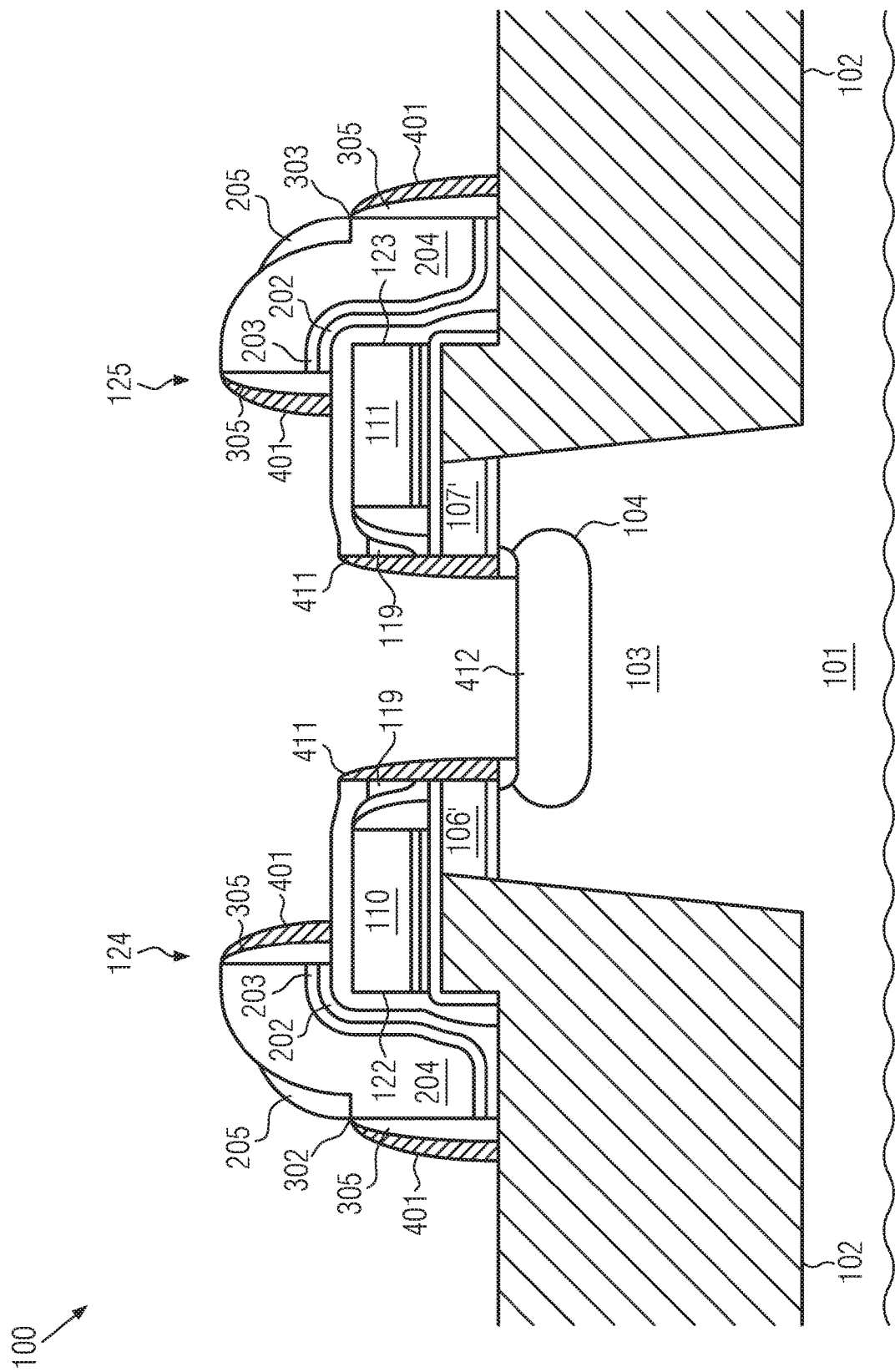

FIGS. 4a, 4b, 4c and 4d show schematic cross-sectional views of the semiconductor structure 100 in a later stage of the method. FIG. 4a shows a cross-section corresponding to the cross-section of FIG. 3a, FIG. 4b shows a cross-section corresponding to the cross-section of FIG. 3b, FIG. 4c shows a cross-section corresponding to the cross-section of FIG. 3c, and FIG. 4d shows a cross-section corresponding to the cross-section of FIG. 3d.

After the formation of the mask 312, one or more etch processes adapted for removing the materials of the polysilicon layer 204, the metal layer 203 and the layer 202 of select gate insulation material may be performed. In some embodiments, features of the one or more etch processes may correspond to features of the one or more etch processes that are performed in the patterning of the gate stack 201 wherein the select gate structure 301 and the gate 308 of the logic transistor are formed. In other embodiments, different parameters of the etch processes may be employed for ensuring a substantially complete removal of the sections 317, 318 of the select gate structure 301 that are not covered by the mask 312 and for allowing a simultaneous etching of the portions of the erase gate 119 below the openings 315, 316 of the mask 312. In some embodiments, a different etch chemistry may be employed and/or a different etch time, for example a longer etch time, may be used.

In the one or more etch processes, the sections 317, 318 of the select gate structure 301 at the openings 313, 314 of the mask 312 may be removed. A similar removal of sections of the select gate structure 301 may be performed in an edge cell at the opposite end of the row of the plurality of pairs of nonvolatile memory cells. Thus, the portion 302 of the select gate structure 301 providing the select gate of the nonvolatile memory cells 124, 126 may be disconnected from the portion 303 of the select gate structure 301 providing the select gate of the nonvolatile memory cells 125, 127. Thus, in the operation of the nonvolatile memory including the nonvolatile memory cells 124 to 127, different voltages may be applied to the select gates of the nonvolatile memory cells 124, 126, on the one hand, and the nonvolatile memory cells 125, 127, on the other hand.

In the removal of the sections 317, 318 of the select gate structure 301, an end face 409 of the portion 302 of the select gate structure 301 and an end face 410 of the portion 303 of the select gate structure 301 may be formed in the edge cell 128. Additionally, end faces 413, 414 of the portion 304 of the select gate structure 301 may be formed.

Furthermore, in the one or more etch processes, a portion of the erase gate 119 that is exposed at the opening 315 and portions of the electrically insulating layers 105, 114, 118 therebelow may be removed so that a source contact region 412, where the semiconductor material of the source region 104 is exposed, is formed.

Moreover, the one or more etch processes may remove a portion of the erase gate 119 that is exposed at the opening 316 of the mask 312 in the edge cell 128 so that the portion of the erase gate 119 in the nonvolatile memory cells 124 to 127 is electrically disconnected from the portion of the erase gate 119 in the outer edge cell 128.

The present disclosure is not limited to embodiments wherein the sections 317, 318 of the select gate structure 301 and portions of the erase gate 119 are removed in a common etch process. In other embodiments, separate etch processes may be performed, and two different masks may be used, wherein one of the masks has the openings 313, 314, the other mask has the openings 315, 316, one of the etch processes removes the sections 317, 318 of the select gate structure 301, and the other etch process removes the portions of the erase gate 119 at the openings 315, 316. In the two etch processes, different etch chemistries adapted for removing the different materials of the select gate structure 301, on the one hand, and the erase gate 119 and the electrically insulating materials therebelow, on the other hand, may be used.

After the one or more etch processes that are performed for removing the sections 317, 318 of the select gate structure 301 and the portions of the erase gate 119 at the openings 315, 316 of the mask 312, the mask 312 may be removed by means of a photoresist strip process, and a layer of a sidewall spacer material, for example, a layer including silicon nitride and/or silicon dioxide, may be substantially isotropically deposited over the semiconductor structure 100, and one or more anisotropic etch processes may be performed. Thus, a sidewall spacer 401 adjacent the select gate structure 301, a sidewall spacer 404 adjacent the gate 308 of the logic transistor and a sidewall spacer 411 at the source contact region 412 may be formed. As shown in FIG. 4c, the sidewall spacer 401 may cover the end face 410 of the portion 303 of the select gate structure 301. Additionally, the sidewall spacer 401 may cover the end faces 409, 413, 414 of the portions 302, 304 of the select gate structure 301.

After the formation of the sidewall spacers 401, 404, 411, one or more ion implantation processes, wherein ions of an N-type dopant are implanted into the semiconductor structure 100, may be performed. The one or more ion implantation processes may form drain regions 402, 403 in the nonvolatile memory cells 124 to 127 as well as a source region 405 and a drain region 406 of the logic transistor that is formed at the logic transistor region 207. Additionally, one or more ion implantation processes, wherein ions of a P-type dopant are implanted into the semiconductor structure 100, may be performed for forming source and drain regions of P-type transistors (not shown) in the semiconductor structure 100. During each of the ion implantation processes, portions of the semiconductor structure 100 wherein no ions are to be implanted may be covered by a photoresist mask (not shown).

After the formation of the source region 405 and the drain regions 402, 403, 406, a protection layer 408 may be formed over the semiconductor structure 100. The protection layer 408 may include an electrically insulating material such as, for example, silicon nitride, and it may be formed by depositing a layer of the material of the protection layer 408 over the semiconductor structure 100 and patterning the layer of the material of the protection layer 408 by means of techniques of photolithography and etching. As can be seen from FIGS. 4c and 5, the protection layer 408 may cover the portions of the semiconductor structure 100 from which the sections 317, 318 of the select gate structure 301 were removed. In particular, portions of the protection layer 408 may be provided at the end faces 409, 410, 413, 414 of the portions 302, 303, 304 of the select gate structure 301. The sidewall spacer 401 and the protection layer 408 may encapsulate the layer 202 of the select gate insulation material and the metal layer 203 at the end faces 409, 410, 413, 414 of the portions 302, 303, 304 of the select gate structure 301. As shown in FIG. 5, the protection layer 408 may cover a substantial part of the edge cell 128 so that a wider neighborhood of the portions of the semiconductor structure 100 from which the sections 317, 318 of the select gate structure 301 were removed may be covered by the protection layer 408. This may improve an encapsulation of the layer 202 of the select gate insulation material and the metal layer 203.

In some embodiments, the protection layer 408 may also be employed as an OP layer (sometimes also denoted as silicide block layer) covering portions of the semiconductor structure 100 wherein no silicide is to be formed. Thus, additional portions of the protection layer 408 may be provided over features wherein no silicide is to be formed such as, for example, resistors (not shown) formed at the semiconductor structure 100.

After the formation of the protection layer 408, a silicidation process may be performed, wherein a metal layer, for example a nickel layer, is deposited over the semiconductor structure 100, and one or more annealing processes are performed for chemically reacting the metal with semiconductor material exposed at the surface of the semiconductor structure 100 that is not covered by the protection layer 408. Thereafter, unreacted metal may be removed by means of an etch process.

Then, an interlayer dielectric may be formed over the semiconductor structure 100, and contacts providing electrical connections to circuit elements formed in the semiconductor structure 100 extending through the interlayer dielectric may be formed. Furthermore, a plurality of interconnect layers including electrically conductive lines and contact vias may be formed for electrically connecting the circuit elements with each other. This may be done in accordance with known middle-of-line and back-end-of-line manufacturing techniques.

The present disclosure is not limited to embodiments wherein the nonvolatile memory cells 124 to 127 include each of a control gate, a floating gate, an erase gate and a select gate, as described above. In other embodiments, the erase gate 119 may be omitted, and the nonvolatile memory cells 124 to 127 may be erased by applying a relatively high positive voltage to the drain regions 402, 403 of the nonvolatile memory cells 124 to 127. Furthermore, in some embodiments, the floating gates 106, 107 of the nonvolatile memory cells 124 to 127 may be omitted, and charge storage layers such as, for example, an oxide-nitride-oxide layer stack may be employed for storing data in the nonvolatile memory cells 124 to 127.

In further embodiments, the control gates 110, 111 and the erase gate 119 may be formed after the formation of the select gates provided by the portions 302, 303 of the select gate structure 301. In such embodiments, the select gate structure 301 may partially overlap gate structures provided by the floating gates 106, 107 of the nonvolatile memory cells 124 to 127.

Furthermore, the present disclosure is not limited to embodiments wherein the select gate structure 301 and gates of logic transistors are simultaneously formed, as described above. In other embodiments, the formation of logic transistors may be performed after the completion of the formation of the nonvolatile memory cells 124 to 127. In such embodiments, the logic transistor region 207 may be covered by a protection layer, which is a different protection layer than the protection layer 408 described above, during the formation of the nonvolatile memory cells 124 to 127 by means of techniques as described above.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor structure, comprising:
   a plurality of pairs of nonvolatile memory cells arranged in a row, each pair of said plurality of pairs of nonvolatile memory cells comprising a first nonvolatile memory cell and a second nonvolatile memory cell;
   an edge cell positioned adjacent to said plurality of pairs of nonvolatile memory cells;
   a first gate and a second gate extending across each of said first nonvolatile memory cells, said second gate partially overlapping said first gate; and
   a third gate and a fourth gate extending across each of said second nonvolatile memory cells, said fourth gate partially overlapping said third gate, wherein each of said first gate, said second gate, said third gate, and said fourth gate has an end portion that is positioned in said edge cell, said edge cell comprising a protection layer positioned over said end portions of each of said first gate, said second gate, said third gate, and said fourth gate, wherein said protection layer covers an end face of said second gate and an end face of said fourth gate.

2. The semiconductor structure of claim 1, wherein said second gate and said fourth gate each comprise a gate insulation layer and a gate electrode, said gate electrode comprising a metal layer.

3. The semiconductor structure of claim 2, further comprising one or more sidewall spacers positioned adjacent to each of said second gate and said fourth gate, wherein at least one of said one or more sidewall spacers does not cover said end face of said second gate and said end face of said fourth gate, and wherein said one or more sidewall spacers and said protection layer encapsulate said metal layer of said gate electrode of each of said second gate and said fourth gate.

4. The semiconductor structure of claim 1, further comprising:
   a fifth gate positioned below said first gate and adjacent to said second gate; and
   a sixth gate positioned below said third gate and adjacent to said fourth gate.

5. The semiconductor structure of claim 4, wherein said first gate is a first control gate of each of said first nonvolatile memory cells, said second gate is a first select gate of each of said first nonvolatile memory cells, said third gate is a second control gate of each of said second nonvolatile memory cells, and said fourth gate is a second select gate of each of said second nonvolatile memory cells.

6. The semiconductor structure of claim 5, wherein said fifth gate is a first floating gate of each of said first nonvolatile memory cells and wherein said sixth gate is a second floating gate of each of said second nonvolatile memory cells, said first floating gate being positioned below said first control gate of a respective one of said first nonvolatile memory cells and said second floating gate being positioned below said second control gate of a respective one of said second nonvolatile memory cells.

7. The semiconductor structure of claim 6, further comprising:
   an erase gate for both of said first nonvolatile memory cell and said second nonvolatile memory cell, said erase gate positioned between said first gate and said third gate; and
   a common source region of said first nonvolatile memory cell and said second nonvolatile memory cell formed in a first portion of a semiconductor substrate between said first and third gates and below said erase gate.

8. The semiconductor structure of claim 7, further comprising a source contact region formed in a second portion of said semiconductor substrate between said first gate and said third gate, wherein said source contact region is not covered by said erase gate, and wherein said erase gate has a sidewall positioned adjacent to said source contact region.

9. The semiconductor structure of claim 7, wherein said end face of said third gate and said end face of said fourth gate are provided over a semiconductor material of said semiconductor substrate.

10. The semiconductor structure of claim 7, wherein a width of a first section of said erase gate positioned adjacent to said end portion of said third gate and said end portion of said fourth gate is smaller than a width of a second section of said erase gate positioned adjacent to said plurality of pairs of nonvolatile memory cells.

11. A semiconductor structure, comprising:
   a pair of nonvolatile memory cells comprising a first nonvolatile memory cell and a second nonvolatile memory cell;
   an edge cell positioned adjacent to said pair of nonvolatile memory cells;
   a first gate extending across said first nonvolatile memory cell and into said edge cell, said first gate comprising a first control gate of said first nonvolatile memory cell and having a first end portion that is positioned in said edge cell, wherein said edge cell comprises a protection layer that is positioned over said first end portion;
   a second gate partially overlapping said first gate and extending across said first nonvolatile memory cell and into said edge cell, said second gate comprising a first select gate of said first nonvolatile memory cell and having a second end portion that is positioned in said edge cell, wherein said protection layer is positioned over said second end portion and covers an end face of said second gate;
   a third gate extending across said second nonvolatile memory cell and into said edge cell, said third gate comprising a second control gate of said second nonvolatile memory cell and having a third end portion that is positioned in said edge cell, wherein said protection layer is positioned over said third end portion;
   a fourth gate partially overlapping said third gate and extending across said second nonvolatile memory cell and into said edge cell, said fourth gate comprising a second select gate of said second nonvolatile memory cell and having a fourth end portion that is positioned in said edge cell, wherein said protection layer is positioned over said fourth end portion and covers an end face of said fourth gate; and one or more sidewall spacers positioned adjacent to each of said second gate and said fourth gate, wherein at least one of said one or more sidewall spacers does not cover said end face of said second gate and said end face of said fourth gate, and wherein said one or more sidewall spacers and said protection layer encapsulate at least a portion of each of said second gate and said fourth gate.

12. The semiconductor structure of claim 11, wherein said second gate and said fourth gate each comprise a gate insulation layer and a gate electrode, said gate electrode comprising a metal layer, wherein said one or more sidewall spacers and said protection layer encapsulate at least said metal layer of said gate electrode of each of said second gate and said fourth gate.

13. The semiconductor structure of claim 11, further comprising:
a fifth gate positioned below said first gate and adjacent to said second gate, said fifth gate comprising a first floating gate of said first nonvolatile memory cell, wherein said first floating gate is positioned below said first control gate; and
a sixth gate positioned below said third gate and adjacent to said fourth gate, said sixth gate comprising a second floating gate of said second nonvolatile memory cell, wherein said second floating gate is positioned below said second control gate.

14. The semiconductor structure of claim 11, further comprising:
an erase gate for both of said first nonvolatile memory cell and said second nonvolatile memory cell, wherein said erase gate is positioned between said first gate and said third gate; and
a common source region of said first and second nonvolatile memory cells formed in a first portion of a semiconductor substrate, wherein said common source region is positioned between said first gate and said third gate and below said erase gate.

15. The semiconductor structure of claim 14, further comprising a source contact region formed in a second portion of said semiconductor substrate between said first gate and said third gate, wherein said source contact region is not covered by said erase gate, and wherein said erase gate has a sidewall positioned adjacent to said source contact region.

16. The semiconductor structure of claim 14, wherein said end face of said third gate and said end face of said fourth gate are provided over a semiconductor material of said semiconductor substrate.

17. The semiconductor structure of claim 14, wherein a width of a first section of said erase gate positioned adjacent to said end portion of said third gate and said end portion of said fourth gate is smaller than a width of a second section of said erase gate positioned adjacent to said pair of nonvolatile memory cells.

18. The semiconductor structure of claim 11, wherein said pair of nonvolatile memory cells is a first pair of nonvolatile memory cells, the semiconductor structure further comprising:
a second pair of nonvolatile memory cells positioned adjacent to said first pair of nonvolatile memory cells and comprising a third nonvolatile memory cell and a fourth nonvolatile memory cell, wherein said first pair of nonvolatile memory cells is positioned between said second pair of nonvolatile memory cells and said edge cell;
wherein said first gate extends across said third nonvolatile memory cell from said first nonvolatile memory cell, said first gate further comprising a third control gate of said third nonvolatile memory cell;
wherein said second gate extends across said third nonvolatile memory cell from said first nonvolatile memory cell, said second gate further comprising a third select gate of said third nonvolatile memory cell;
wherein said third gate extends across said fourth nonvolatile memory cell from said second nonvolatile memory cell, said third gate further comprising a fourth control gate of said fourth nonvolatile memory cell; and
wherein said fourth gate extends across said fourth nonvolatile memory cell from said second nonvolatile memory cell, said fourth gate further comprising a fourth select gate of said fourth nonvolatile memory cell.

19. The semiconductor structure of claim 18, further comprising:
a fifth gate positioned below said first gate and adjacent to said second gate, said fifth gate comprising a first floating gate of said first nonvolatile memory cell and a third floating gate of said third nonvolatile memory cell, wherein said first floating gate is positioned below said first control gate and said third floating gate is positioned below said third control gate; and
a sixth gate positioned below said third gate and adjacent to said fourth gate, said sixth gate comprising a second floating gate of said second nonvolatile memory cell and a fourth floating gate of said fourth nonvolatile memory cell, wherein said second floating gate is positioned below said second control gate and said fourth floating gate is positioned below said fourth control gate.

20. The semiconductor structure of claim 18, further comprising:
an erase gate for both of said first pair of nonvolatile memory cells and said second pair of nonvolatile memory cells, wherein said erase gate is positioned between said first gate and said third gate; and
a common source region of for both of said first pair of nonvolatile memory cells and said second pair of nonvolatile memory cells formed in a first portion of a semiconductor substrate, wherein said common source region is positioned between said first gate and said third gate and below said erase gate.

* * * * *